United States Patent
Asakura et al.

[11] Patent Number: 5,726,940
[45] Date of Patent: Mar. 10, 1998

[54] SEMICONDUCTOR MEMORY DEVICE OF WHICH PRESCRIBED STATE OF OPERATION IS TERMINATED UNDER A PRESCRIBED CONDITION AND METHOD OF OPERATING A SEMICONDUCTOR MEMORY DEVICE FOR TERMINATING PRESCRIBED STATE OF OPERATION

[75] Inventors: Mikio Asakura; Hideto Hidaka; Kiyohiro Furutani, all of Hyogo, Japan

[73] Assignee: Mitsubishi Denki Kabushiki Kaisha, Tokyo, Japan

[21] Appl. No.: 833,207

[22] Filed: Apr. 14, 1997

Related U.S. Application Data

[63] Continuation of Ser. No. 623,803, Mar. 29, 1996, abandoned.

[30] Foreign Application Priority Data

Jul. 10, 1995 [JP] Japan ................................ 7-173667

[51] Int. Cl.[6] .................................................. G11C 29/00
[52] U.S. Cl. .......................... 365/201; 365/222; 365/230.06
[58] Field of Search .............................. 365/201, 230.06, 365/222; 371/21.1

[56] References Cited

U.S. PATENT DOCUMENTS 5,467,314  11/1995  Miyazawa et al. .................. 365/201
5,596,537  1/1997  Sukegawa et al. .................. 365/201

OTHER PUBLICATIONS

Ishihara et al., "Standard 4M Bit DRAM Having x1/x4 Structure Manufactured by Way of Trial, Mass Production Around 1989 Expected", Nikkei Electronics 1987, Apr. 6, (No. 418) pp. 149–163.

Primary Examiner—David C. Nelms
Assistant Examiner—Huan Hoang
Attorney, Agent, or Firm—Lowe, Price, LeBlanc & Becker

[57] ABSTRACT

In the semiconductor memory device in accordance with the present invention, when test mode is entered at WCbR+super $V_{IH}$+address key timing, the test mode is terminated only at the WCbR+super $V_{IH}$+address key timing. Therefore, when refresh is to be started in the test mode, erroneous entrance to another test mode can be prevented, ensuring highly reliable testing. Further, since it is not necessary to take into account the special condition to enter the refreshing operation in the test mode, formation of a test pattern is facilitated.

18 Claims, 7 Drawing Sheets

ADDRESS KEY CIRCUIT 5,726,940

SEMICONDUCTOR MEMORY DEVICE OF WHICH PRESCRIBED STATE OF OPERATION IS TERMINATED UNDER A PRESCRIBED CONDITION AND METHOD OF OPERATING A SEMICONDUCTOR MEMORY DEVICE FOR TERMINATING PRESCRIBED STATE OF OPERATION

This application is a continuation of application Ser. No. 08/623,803 filed Mar. 29, 1996, now abandoned.

BACKGROUND OF THE INVENTION

1. Field of the Invention

The present invention relates to a semiconductor memory device and operating method thereof. More specifically, the present invention relates to a semiconductor memory device of which a prescribed state of operation is terminated under a prescribed condition, and to a method of operation for terminating the prescribed state of operation.

2. Description of the Background Art

For a dynamic random access memory (hereinafter referred to as a "DRAM") which is a typical example of a semiconductor memory device, various test modes have been proposed for reducing test time and for facilitating evaluation. Multibit test is a representative example of such test modes. Multibit test is a test mode open to the user, that is, a user available test mode. Multibit test will be described referring to a 64 megabit DRAM as an example.

FIG. 5 is a schematic block diagram showing a general 64 Mbit DRAM×1 device. Here, the expression "×1 device" means that data is read and written bit by bit.

Referring to FIG. 5, a general 64 Mbit DRAM includes an /RAS input pin 51, an address input pin 53, /CAS input pin 55, data output pin 57, data input pin 59, /WE input pin 61, /RAS buffer 63, /CAS buffer 65, /WE buffer 67, a row address buffer 69, a column address buffer 71, a data output buffer 73, a data input buffer 75, a row selecting circuit 77, a column selecting circuit 79, a memory cell array 81 and a data input/output line 83.

In a normal operation mode, that is, not in the test mode, 13 bits of row addresses RA0 to RA12 and 13 bits of column addresses CA0 to CA12 are input in time divisional manner from address input pin 53. Though not shown, address input pin 53 includes 13 address input pins A0 to A12.

By a total of 26 bits of addresses, one of the 64 Mbits of memory cells, not shown, included in memory cell array 81 is selected, and data is written to or read from the selected memory cell.

/RAS input pin 51 receives a row address strobe signal /RAS. Row address strobe signal /RAS is input to /RAS buffer 63 and output as an internal /RAS, and input to row address buffer 69.

Further, row address buffer 69 receives a row address. Row address buffer 69 takes in the row address as an internal row address in accordance with the internal /RAS. The row address taken in by row address buffer 69 is transmitted to row selecting circuit 77. Row selecting circuit 77 receives the row address and, though not shown, selects and drives a specific word line. The data of the memory cell connected to the selected and driven word line is transmitted to a sense amplifier, not shown, through a bit line pair, not shown.

/CAS input pin 55 receives a column address strobe signal /CAS. Column address strobe signal /CAS is input to /CAS buffer 65 and output as internal /CAS, and input to column address buffer 71. Further, column address buffer 71 receives a column address from address input pin 53.

Column address buffer 71 takes in the column address as an internal column address in accordance with the internal /CAS, which column address is transmitted to column selecting circuit 79. Column selecting circuit 79 receives the column address and selects a specific bit line pair.

When data is to be read, the data read to the selected bit line pair is output through data input/output line 83, data output buffer 73 and data output pin 57, as output data Dout.

When data is to be written, input data Din is input through data input pin 59 to data input buffer 75. Write enable signal /WE is input through /WE input pin 61 to /WE buffer 67. Write enable signal /WE is input to data input buffer 75 through /WE buffer 67.

Data input buffer 75 transmits input data Din to data input/output line 83 in response to write enable signal /WE. Input data Din is transmitted to the selected bit line pair and written to the memory cell. Write enable signal /WE is used for distinguishing reading or writing.

In the DRAM shown in FIG. 5, writing or reading is performed bit by bit. Therefore, in order to test all the memory cells included in memory cell array 81, 64M times of writing cycles and reading cycles are necessary. This requires very long time for testing.

Accordingly, in order to reduce time for testing the memory cells, multibit test mode is incorporated. When multibit test mode is entered, 5 bits of column addresses CA8 to CA12 are degenerated, and to 32 bits of memory cells selected in accordance with row addresses RA0 to RA12 and column addresses CA0 to CA7, same data is written simultaneously. Then data is read simultaneously from 32 bits of memory cells. At this time, if all of the 32 bits of read data are the same, a signal which is at a "H" (high) level is output from an output pin, not shown. When there is any bit of data which is different among 32 bits of read data, a signal which is at an "L" (low) level is output from the output pin.

This enables simultaneous testing of 32 bits of memory cells, and hence the time necessary for testing can be reduced to 1/32 as compared with the test performed bit by bit. More specifically, when the test is performed bit by bit, 64M write cycles and read cycles are necessary, while according to the above described method, tests can be performed by only 2M write cycles and read cycles.

FIG. 6 shows a signal timing to enter the multibit test mode.

Referring to FIG. 6, a row address strobe signal /RAS falls after the fall of column address strobe signal /CAS and write enable signal /WE. Such signal timing is referred to as WCbR (/WE and /CAS before /RAS) timing. Multibit test mode is entered in response to the fall of /RAS at this timing.

FIG. 7 shows a signal timing to exit from the multibit test mode.

Referring to FIG. 7, column address strobe signal /CAS is kept low while row address strove signal /RAS falls. Such timing is referred to as ROR (/RAS only refresh) timing. In response to the rise of /RAS at the end of the cycle in such signal timing, multibit test mode is terminated.

FIG. 8 shows another signal timing to exit from the multibits test mode.

Referring to FIG. 8, column address strobe signal /CAS falls, and thereafter, row address strobe signal /RAS falls. Such timing is referred to as CbR (/CAS before /RAS) timing. Multibit test mode is terminated in response to the rise of /RAS at the end of the cycle in such timing.

Generally, in a general purpose DRAM, some other test modes which are not open to the user, in addition to the multibits test mode described above, are incorporated. One such test mode includes stress test in which excessive stress voltage higher than in the normal operation of reading/ writing or the like is applied to a dielectric film of a capacitor constituting a memory cell, to test the operation under such condition.

In a general purpose DRAM Which does not have a special test pin, a method to enter such a test mode which is not open to the user must be devised. Since the test mode is not open to the user, such special test mode must never be entered during a normal operation. Therefore, such test mode that is not open to the user must be entered through a method which is never used by the user.

Accordingly, such a test mode that is not open to the user is entered in the manner described in the following.

FIG. 9 shows a signal timing to enter the test mode which is not open to the user. Referring to FIG. 9, column address strobe signal CAS and write enable signal /WE are caused to fall, and then row address strobe signal /RAS is caused to fall. Then, when row address strove signal RAS falls, a voltage higher than the input voltage generally acceptable for the DRAM (hereinafter referred to as "super $V_{IH}$" is applied to a pin, other than /RAS input pin 51, /CAS input pin 55 and /WE input pin 61 shown in FIG. 5, for example, to an address pin A0 to which an address is input.

Further, at this time, signals are input through several address pins (in the example shown in FIG. 9, to address pins A1 and A2). Combination of the amplitudes of the two signals input through address pins A1 and A2 is referred to as an address key. The timing described above is referred to as WCbR+super $V_{IH}$+address key timing. The test mode which is not open to the user is entered in response to the fall of /RAS at such timing.

Which of the plurality of the test modes is entered is determined by varying address keys.

There are four different combinations (address keys) of signal amplitudes input to two address pins A1 and A2. More specifically, there are the following address keys where the amplitudes of two signals input through address pins A1 and A2 are represented by A1 and A2, respectively:

(A1, A2)=(0, 0), (1, 0), (0, 1), (1,1).

By using such address keys, four different test modes which are not open to the user may be entered. The test mode entered in such a manner is terminated at the ROR and CbR timing described with reference to FIGS. 7 and 8, respectively, similar to the exit from multibit test mode.

As described above, in a general DRAM, when a test mode is entered at WCbR+super $V_{IH}$+address key timing, the test mode is terminated at the ROR or CbR timing. Therefore, while general refresh operation not in the test mode is entered at the ROR or CbR timing, refresh in the test mode must be entered at the WCbR timing.

Therefore, when the test should be performed using various test patterns in one of the test modes entered at the WCbR+super $V_{IH}$+address key timing, WCbR timing must be utilized for the refreshing operation.

Accordingly, when test mode is entered at the timing of WCbR+super $V_{IH}$+address key, test program must be prepared taking into consideration that WCbR timing is used for the refreshing operation, which imposes a restriction on the test program.

This is a problem caused by the fact that the timing (ROR or CbR timing) for entering refresh mode during normal operation other than the test mode differs from the timing (WCbR timing) for entering the refresh mode in the test mode.

Further, when the test mode has been started at the WCbR+super $V_{IH}$+address key timing and WCbR timing is set for starting refreshing operation, it is possible that multibit test mode (which is initiated at WCbR timing) or other test modes which is entered by WCbR+super $V_{IH}$+ address key may be erroneously started, hindering the desired test.

SUMMARY OF THE INVENTION

The present invention was made to solve the above described problem and its object is to provide a semiconductor memory device facilitating formation of an operation pattern (test pattern) for a prescribed state of operation (test mode) and to provide a method of operating a semiconductor memory device therefor.

Another object of the invention is to provide a semiconductor memory device in which in a prescribed state of operation (one test mode), when an operation (refresh) necessary at that time is to be started, erroneous entrance to other state of operation (another test mode) can be prevented and the prescribed state of operation (test mode) can be ensured, and to provide a method of operating a semiconductor memory device therefor.

The semiconductor memory device in accordance with a first aspect of the present invention includes a detecting circuit receiving a plurality of first external signals and a second external signal, for outputting a detecting signal when level change in the plurality of first external signals occurs at a prescribed timing while the second external signal is at a prescribed potential; a control signal generating circuit receiving a third external signal for outputting a first control signal when the third external signal attains to the first level and the detection signal is received, and for outputting a second control signal when the third external signal attains to a second level and the detection signal is received; and the semiconductor memory device enters a first state of operation in response to the first control signal and exits the prescribed state of operation in response to the second control signal.

As described above, in the semiconductor memory device in accordance with a first aspect of the present invention, when level change in the plurality of first external signals occur at a prescribed timing, the second external signal is at a prescribed potential and the third external signal is at the second level, the device exits the prescribed state of operation. Such condition is used only for the exit from the prescribed state of operation.

In this manner, if it is necessary to start an operation in a prescribed state of operation, a special condition used only to enter the aforementioned operation in the prescribed state of operation becomes unnecessary.

As a result, when an operation is necessary in a prescribed state of operation, the problem that the special condition to enter such operation is necessary and such a special condition to enter the operation conflicts a condition to enter another state of operation can be eliminated.

In other words, it is not necessary to take into account the special condition to start the necessary operation, and hence an operation pattern in the prescribed state of operation can be easily formed.

Further, erroneous entrance to other state of operation which is different from the prescribed state of operation when the necessary operation is to be started can be prevented, and hence the prescribed state of operation can be ensured.

The method of operating a semiconductor memory device in accordance with the second aspect of the present invention includes the steps of: inputting a plurality of first signals externally such that the signals have the levels changed at a prescribed timing; inputting a second signal of a prescribed potential externally; outputting a detection signal when the second external signal of the prescribed potential is received at the time point when the plurality of first signals changing in level at the prescribed timing are received; externally inputting a third external signal at a first level; outputting a first control signal when the third external signal of the first level and the detection signal are received; entering a prescribed state of operation in response to the first control signal; externally inputting a third external signal of a second level; outputting a second control signal when the third external signal at the second level and the detection signal are received; and exiting the prescribed state of operation in response to the second control signal.

As described above, in the method of operating semiconductor memory device in accordance with the second aspect of the present invention, when the second external signal attains to a prescribed potential and the third external signal is at the second level when the level change of the plurality of first external signals occur at a prescribe timing, the prescribed state of operation is terminated. Such condition is used only for the exit from the prescribed state of operation.

Therefore, when an operation is to be started in a prescribed state of operation, special condition used in the prescribed state of operation to start the aforementioned operation becomes unnecessary.

As a result, when it is necessary to start an operation in a prescribed state of operation, the problem that special condition to enter such an operation is necessary and that the condition to enter such operation conflicts a condition to enter another state of operation which is different from the prescribed state of operation, can be eliminated.

More specifically, since it is not necessary to take into account the special condition to enter a necessary operation, operation pattern for the prescribed state of operation can be formed easily.

Further, erroneous entrance to another state of operation which is different from the prescribed state of operation when the necessary operation is started can be prevented, and hence the prescribed state of operation is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The semiconductor memory device and method of operation in accordance with the present invention will be described with reference to the figures.

Figure 1:
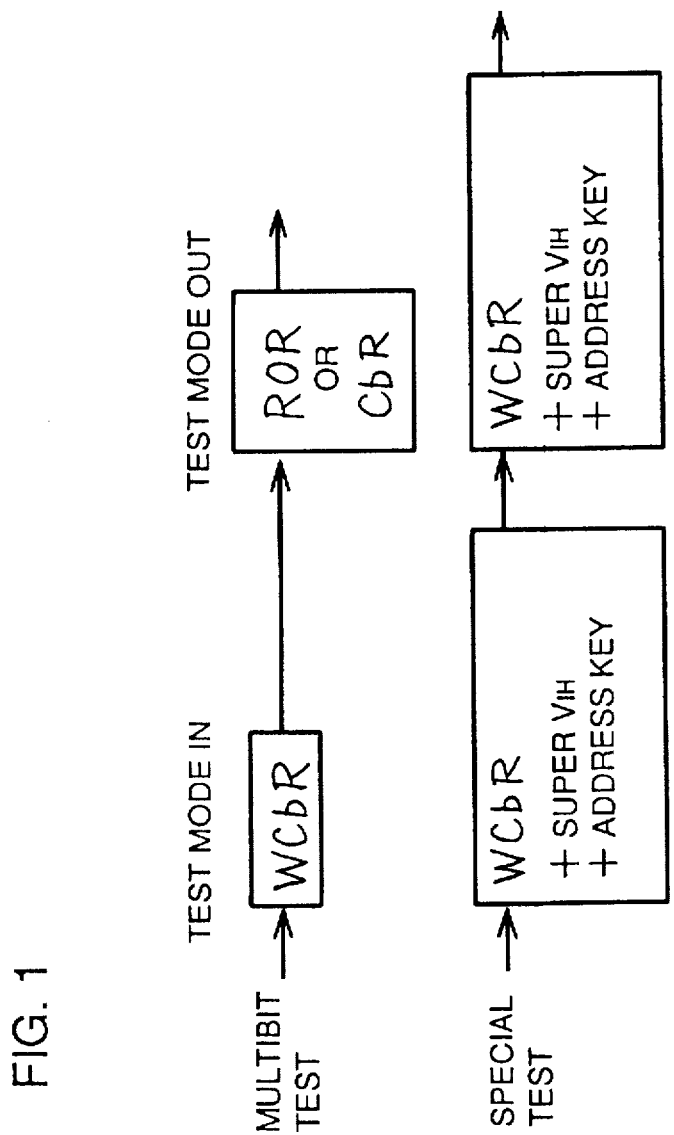
FIG. 1 shows a concept of a semiconductor memory device in accordance with an embodiment of the present invention.
Figure 5:
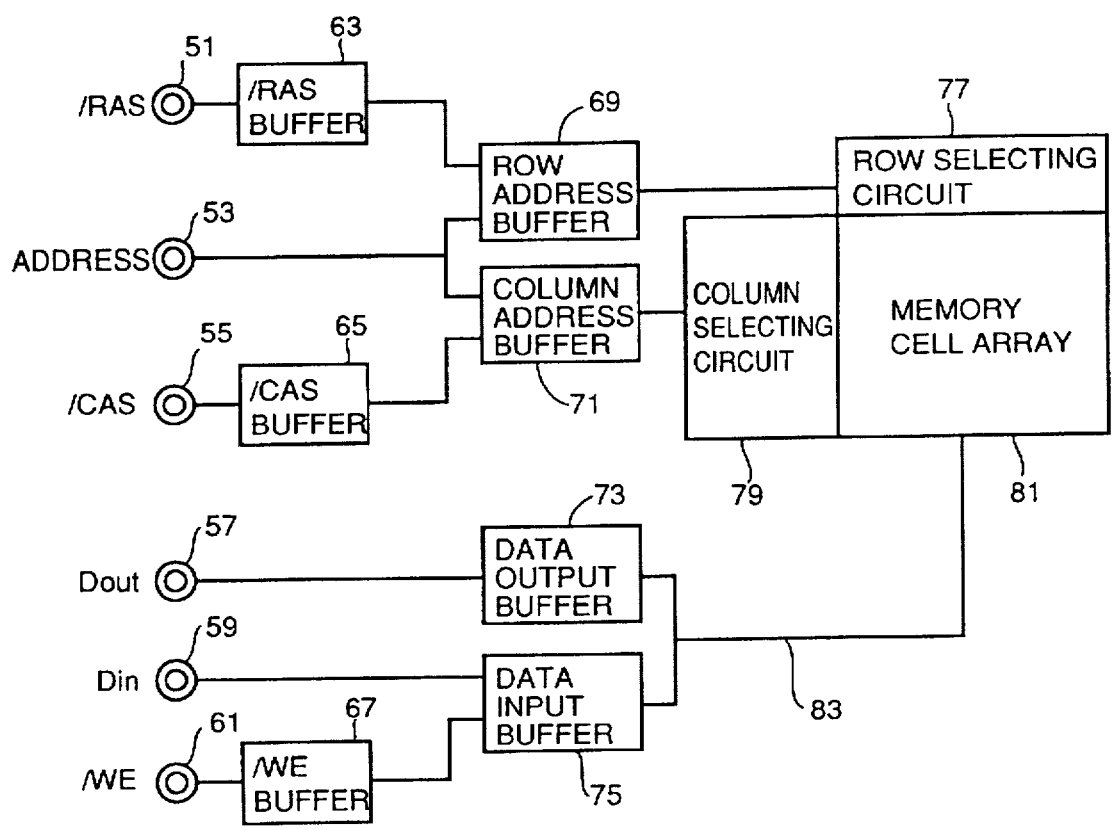
FIG. 5 is a schematic block diagram showing a general semiconductor memory device.

FIG. 1 shows the concept of the semiconductor memory device and method of operation in accordance with one embodiment of the present invention. The whole structure of the semiconductor memory device in accordance with the present embodiment is the same as the semiconductor device of FIG. 5.

Figure 7:
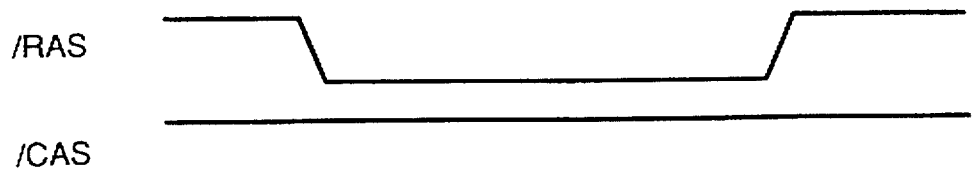
FIG. 7 shows ROR timing.
Figure 8:
FIG. 8 shows CbR timing.

Referring to FIG. 1, in the semiconductor memory device and operating method thereof in accordance with the present embodiment, when multibit test is to be performed, test mode is entered (test mode in) at WCbR timing. The WCbR timing is the same as described with reference to FIG. 6. The test mode is terminated (test mode out) at ROR or CbR timing. The ROR and CbR timings are the same as those described with reference to FIGS. 7 and 8.

Figure 9:
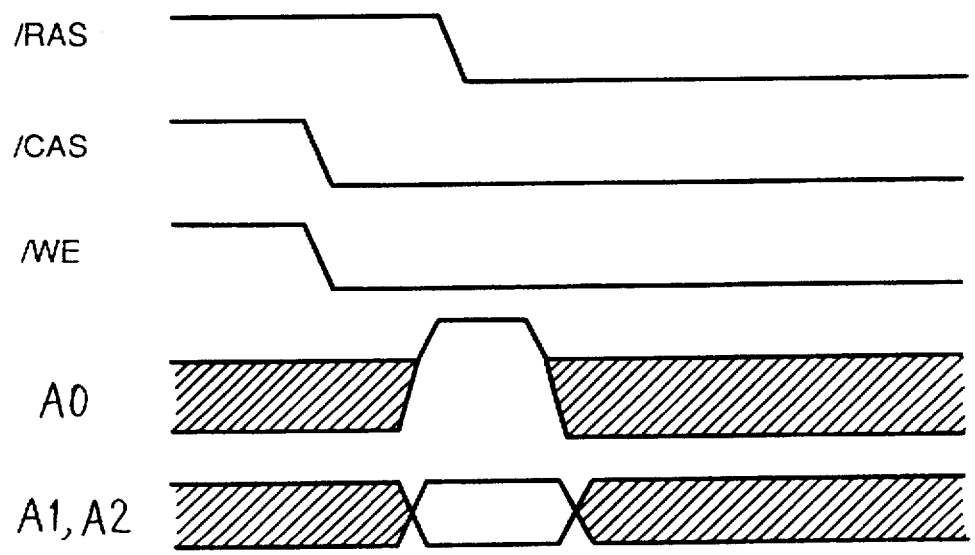
FIG. 9 shows WCbR+super $V_{IH}$+address key timing.

When a special test not open to the user, for example, stress test is to be carried out, test mode is entered at the WCbR+super $V_{IH}$+address key timing. When the test mode is to be terminated, the exit timing is also WCbR+super $V_{IH}$+address key timing. The WCbR+super $V_{IH}$+address key timing is the same as that described with reference to FIG. 9.

In the present embodiment, combination of signal amplitudes input through two address pins A1 and A2, not shown, is used as the address key. Amplitudes of the signals input through address pins A1 and A2 are represented by A1 and A2. Here, the address key can be represented as (A1, A2).

In the present embodiment, three different test modes (special tests such as stress tests not open to the user) are incorporated, which are entered by the following three address keys.

(A1, A2)=(0, 0), (1, 0), (0, 1).

An address key for the exit from the test mode which has been entered by these three address keys is set as follows:

(A1, A2)=(1, 1).

In summary, in accordance with the present embodiment, the test mode which is entered at WCbR+super $V_{IH}$+address key timing is terminated only at the WCbR+super $V_{IH}$+address key timing.

Meanwhile, the multibit test mode which is entered at WCbR timing is terminated at ROR or CbR timing, as in the prior art.

Thus, when test mode is entered at the WCbR+super $V_{IH}$+address key timing and while test is performed using various test patterns in the test mode, ROR and CbR timings may be used to enter the refresh mode. Conventionally, when refresh is to be carried out in the test mode, WCbR timing has been used. As can be understood from the foregoing, at the time of refresh in the test mode, the possibility of erroneous entrance to the multibit test mode (which is entered at WCbR timing) or other test mode (entered at WCbR+super $V_{IH}$+address key timing) can be eliminated. Further, the method to enter the refresh in the test mode is the same as the method to enter refresh in an operation mode other than the test mode. More specifically, no matter whether the refresh mode is entered in the test mode or not in the test mode, ROR or CbR timing may be used.

When the test pattern is formed for the test program, it becomes unnecessary to take into account the special condition to enter refresh mode in test mode. Conventionally, to enter refresh mode in the test mode, a special condition (WCbR timing), which is different from the condition to enter refresh mode in an operation mode other than the test mode, has been provided.

Figure 2:
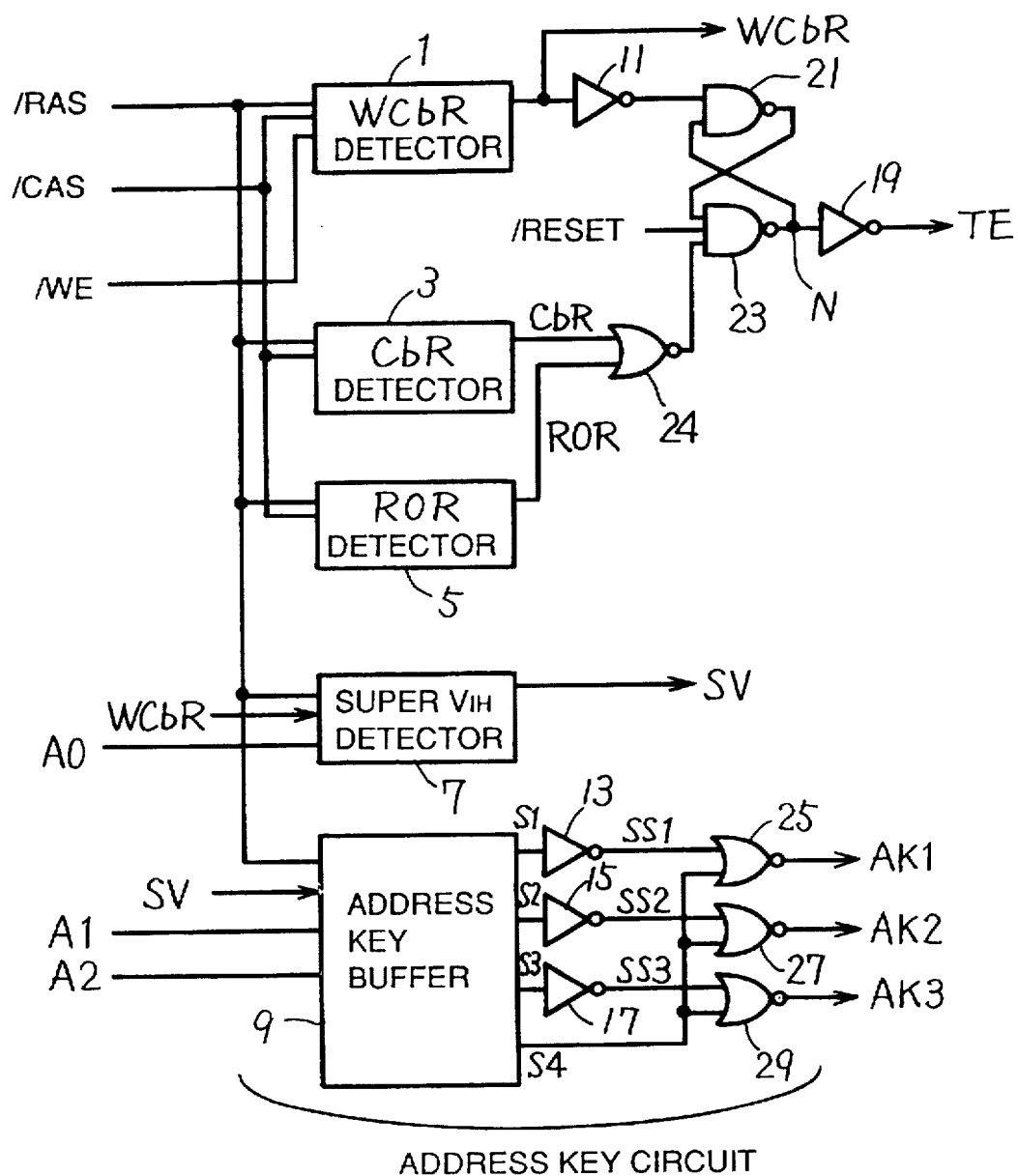
FIG. 2 is a schematic block diagram showing a characteristic portion of the semiconductor memory device in accordance with an embodiment of the present invention.

FIG. 2 is a schematic block diagram showing a characteristic portion of the semiconductor memory device in accordance with the present embodiment.

Referring to FIG. 2, the characteristic portion of the semiconductor memory device in accordance with the present embodiment includes an WCbR detector 1, CbR detector 3, an ROR detector 5, a super $V_{IH}$ detector 7, an address key buffer 9, inverters 11, 13, 15, 17, 19, NAND circuits 21 and 23, and NOR circuits 24, 25, 27 and 29. Address key buffer 9, inverters 13 to 17 and NOR circuits 25 to 29 constitute an address key circuit.

WCbR detector 1 includes row address strobe signal /RAS, column address strobe signal /CAS and write enable signal /WE. WCbR detector 1 outputs a signal WCbR indicating whether or not it is WCbR timing.

CbR detector 3 receives row address strobe signal /RAS and column address strobe signal /CAS. CbR detector 3 outputs a signal CbR indicating whether or not it is CbR timing. ROR detector 5 receives row address strobe signal /RAS and column address strobe signal /CAS. ROR detector 5 outputs a signal ROR indicating whether or not it is an ROR timing.

The signal /RESET input to NAND circuit 23 is for setting the potential at a node N to "H" level at the time of power on. The signal /RESET is at "L" level at the time of power on, then it attains to the "H" level and thereafter it is kept at the "H" level.

The signal TE is a signal to enter multibit test mode or to exit from multibit test mode.

When the signal TE is at the "H" level, multibit test mode is entered and when the signal TE attains to the "L", multibit test mode is terminated.

Super $V_{IH}$ detector 7 receives row address strobe signal /RAS, signal WCbR and a signal from address pin A0. Super $V_{IH}$ detector 7 outputs a signal SV. Super $V_{IH}$ detector 7 outputs the signal SV at the "H" level (5 V) when the signal WCbR indicating the WCbR timing is input and the potential of the signal input through address pin A0 attains to super $V_{IH}$ (of, for example, 8V when the power supply potential is 5 V). Address key buffer 9 receives row address strobe signal /RAS, signal SV, the signal input through address pin A1 and the signal input through address pin A2. Address key buffer 9 latches the signals from address pins A1 and A2 when the signal SV is at the "H" level. Address key buffer 9 outputs signals S1, S2, S3 and S4.

The signal S1 attains to the "H" level when the signal SV attains to the "H" and (A1, A2)=(0, 0). The signal S2 attains to the "H" level when the signal SV attains to the "H" level and (A1, A2)=(1, 0). The signal S3 attains to the "H" level when the signal SV attains to the "H" level and (A1, A2)=(0, 1).

The signal S4 attains to the "H" level when the signal SV attains to the "H" level and (A1, A2)=(1, 1). Signals S1 to S3 relates to entrance of test mode. Signal S4 is related to exit from the test mode. Signal S1 is turned to signal SS1 by inverter 13. Signal S2 is turned to signal SS2 by inverter 15. Signal S3 is turned to signal SS3 by inverter 17.

NOR circuit 25 receives signals SS1 and S4, and outputs a signal AK1. NOR circuit 27 receives signals SS2 5 and S4 and outputs a signals AK2. NOR circuit 29 receives signal SS3 and S4 and outputs a signal AK3.

Signals AK1 to AK3 are signals for the entrance to or exit from the test mode. The super $V_{IH}$ which is the potential signal input from address pin A0 refers to a voltage higher than the range of a normally used voltage.

Figure 3:
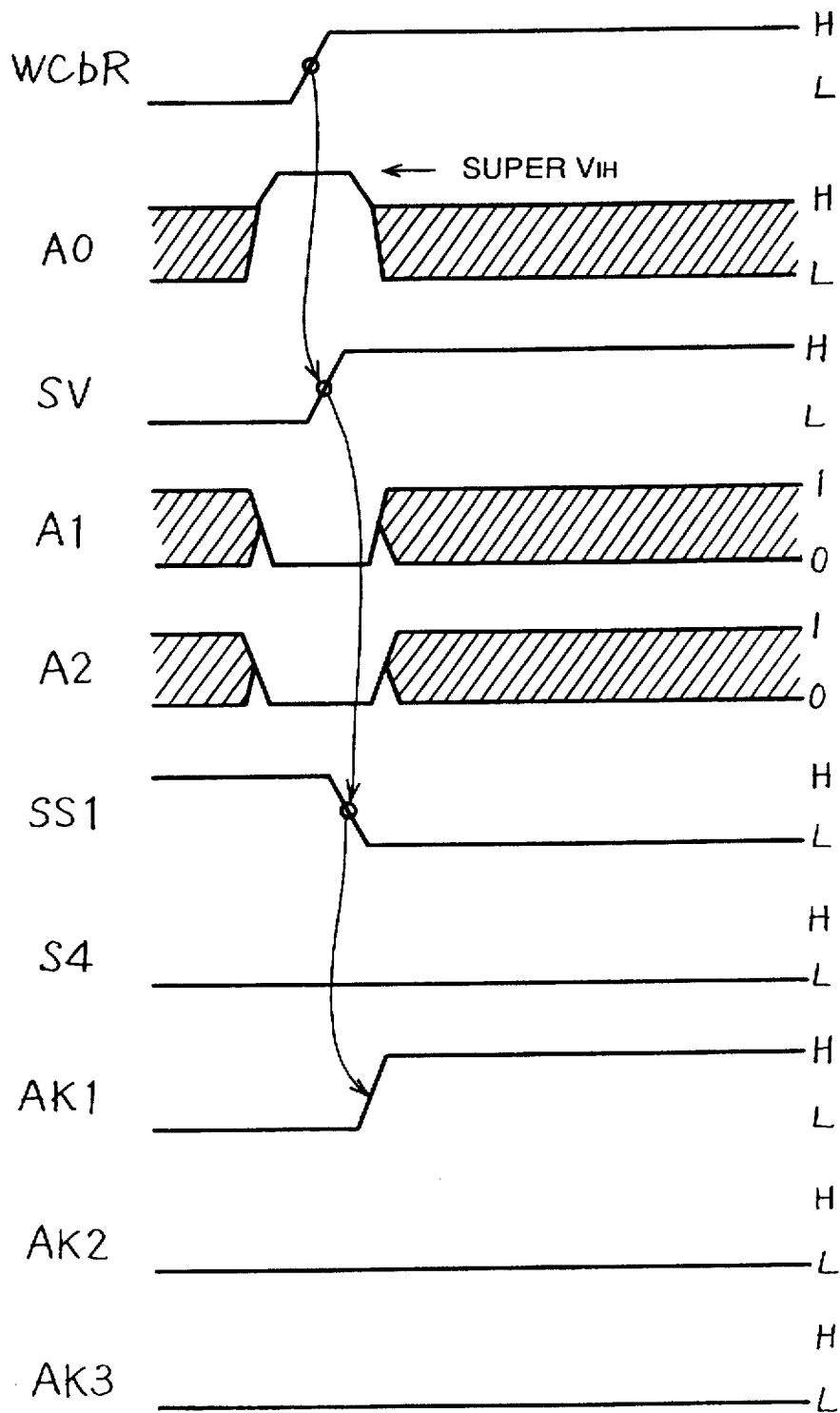
FIG. 3 is a timing chart showing the operation of the characteristic portion of the semiconductor memory device shown in FIG. 2.

FIG. 3 is a timing chart showing the operation of the characteristic portion of the semiconductor memory device shown in FIG. 2. FIG. 3 illustrates entrance to the test mode.

Figure 6:
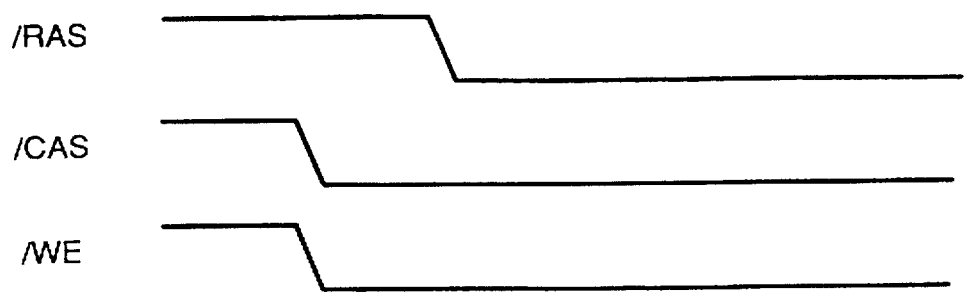
FIG. 6 shows WCbR timing.

Referring to FIGS. 2 and 3, the signal WCbR is set to the "H" level when WCbR timing such as shown in FIG. 6 occurs. The signal WCbR attains to the "H" level in response to the fall of row address strobe signal /RAS of FIG. 6.

When the signal WCbR is set to the "H" level and the potential of the signal from address pin A0 is at super $V_{IH}$, the signal SV from super $V_{IH}$ detector 7 is set to the "H" level. At this time, if the signals input from address pins A1 and A2 are both at the "L" level, the signal SS1 from inverter 13 is set to the "L" level. More specifically, if the address key is as shown below when the signal SV is set to the "H" level, the signal SS1 is set to the "L" level:

(A1, A2)=(0, 0).

As described above, since address key (A1, A2) is not (1, 1), the signal S4 is at the "L" level. Since the signal SS1 input to NOR circuit 25 is at the "L" level and the signal S4 is at the "L" level, the signal AK1 is set to the "H" level.

When the signal AK1 attains to the "H" level, a prescribed test mode is entered. Now, since the input address key (A1, A2) is (0, 0), signals SS2 and SS3 are both at the "H" level, and signals AK2 and AK3 are at the "L" level. Here, by setting signal AK2 or AK3 to the "H" level in the same manner as described above, the corresponding test mode can be set.

Figure 4:
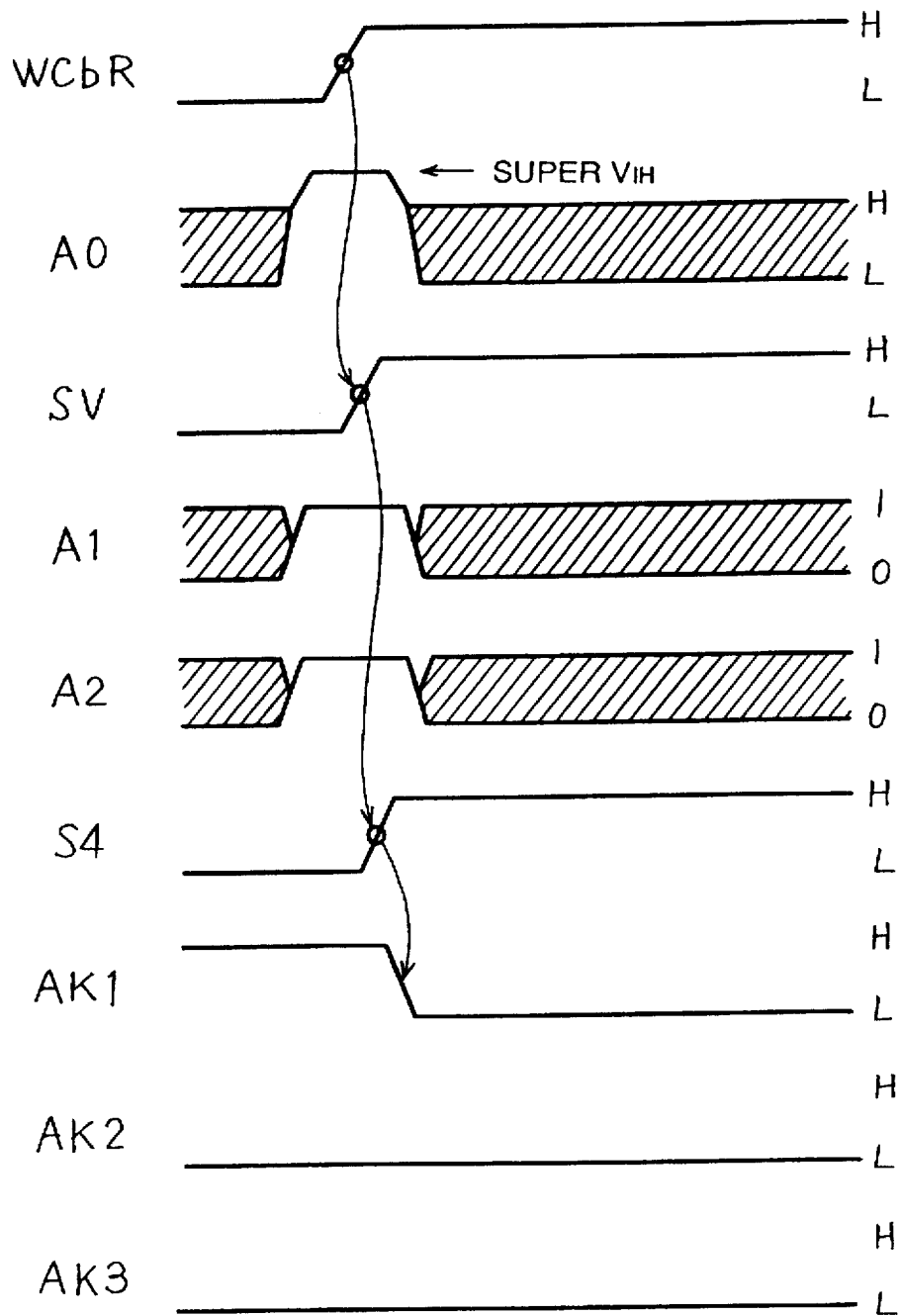
FIG. 4 is a time chart showing another operation of the characteristic portion of the semiconductor memory device shown in FIG. 2.

FIG. 4 is a timing chart showing another operation of the characteristic portion of the semiconductor memory device shown in FIG. 2.

Referring to FIG. 4, the signal WCbR, the signal from address pin A0, the signal SV and the signals AK2 and AK3 are the same as those described with reference to FIG. 3. While FIG. 3 shows how to enter the test mode, FIG. 4 shows how to exit from the test mode.

Referring to FIGS. 2 and 4, when the signal SV attains to the "H" level and signals input from address pins A1 and A2 are both at the "H" level, the signal S4 from address key buffer 9 is set to the "H" level. More specifically, when such an address key as shown below is input while the signal SV is at the "H" level, the signal S4 attains to the "H" level:

(A1, A2)=(1, 1).

NOR circuit 25 receives the signal S4 at the "H" level, and sets the signal AK1 to the "L" level. When the signal AK1 attains to the "L" level, the test mode is terminated.

As described above, in the present embodiment, when the test mode is entered at the WCbR+super $V_{IH}$+address key timing, the test mode is terminated only at the WCbR+super $V_{IH}$+address key timing. Therefore, when refresh mode is to be started in the test mode, ROR or CbR timing may be used, and hence erroneous entrance to the multibit test mode or other test mode at the time of refresh can be prevented. More specifically, testing in the desired test mode can be surely performed, and thus highly reliable test becomes possible.

Further, refresh mode can be entered by using ROR or CbR timing, no matter whether the refresh is in or not in the test mode. Therefore, the test pattern can be formed by a test program without taking into account a special condition to enter the refresh mode during the test mode. Namely, formation of a test pattern is facilitated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a detecting means for receiving a plurality of first mode signals and a second mode signal, for outputting a detection signal when said second mode signal is at a prescribed potential higher than a power supply potential at a prescribed timing defined by a combination of the plurality of the first mode signals; and a control signal generating means for receiving a third mode signal, for outputting a first control signal when said third mode signal attains to a first level and said detection signal is received, and for outputting a second control signal when said third mode signal attains to a second level and said detection signal is received; wherein the semiconductor memory device enters a prescribed state of operation in response to said first control signal and goes out from said prescribed state of operation in response to said second control signal.

2. The semiconductor memory device according to claim 1, wherein one of said plurality of first mode signals is a row address strobe signal;

another of said plurality of first mode signals is a column address strobe signal;

still another of said plurality of first mode signals is a write enable signal;

said second mode signal is a signal input through any of a plurality of address pins; and said third mode signal is a signal derived from at least one of said plurality of address pins other than that one through which said second mode signal is input.

3. The semiconductor memory device according to claim 2, wherein said prescribed timing is a timing at which said row address strobe signal attains to a third level after said column address strobe signal has attained to a fourth level and said write enable signal has attained to a fifth level.

4. The semiconductor memory device according to claim 3, wherein said prescribed state of operation is a test mode.

5. The semiconductor memory device according to claim 1, further comprising:

another control signal generating means for receiving the plurality of first mode signals, for outputting a third control signal at the prescribed timing defined by the combination of the plurality of the first mode signals, and for outputting a fourth control signal at another prescribed timing defined by another combination of the plurality of the first mode signals; wherein the semiconductor memory device enters the other prescribed state of operation in response to said third control signal and goes out from said another prescribed state of operation in response to said fourth control signal.

6. The semiconductor memory device according to claim 5, wherein said other prescribed state of operation is a test mode.

7. The semiconductor memory device according to claim 5, wherein one of said plurality of first mode signals is a row address strobe signal;

another of said plurality of first mode signals is a column address strobe signals; and still another of said plurality of first mode signals is a write enable signal.

8. The semiconductor memory device according to claim 7, wherein said prescribed timing is a timing at which said row address strobe signal attains to a third level after said column address strobe signal has attained to a fourth level and said write enable signal has attained to a fifth level, and said other prescribed timing is a timing at which said row address strobe signal attains to a sixth level after having attained to a seventh level for a certain time period while said column address strobe signal is at an eighth level.

9. The semiconductor memory device according to claim 7, wherein said prescribed timing is a timing at which said row address strobe signal attains to a third level after said column address strobe signal has attained to a fourth level and said write enable signal has attained to a fifth level, and said other prescribed timing is a timing at which said row address strobe attains to a ninth level after having attained to a tenth level following said column address strobe signal attaining to an eleventh level.

10. A method of operating a semiconductor memory device comprising the steps of:

inputting a plurality of first mode signals such that levels of the signals change at a prescribed timing;

inputting a second mode signal at a prescribed potential higher than a power supply potential;

outputting a detection signal when said second mode signal at said prescribed potential is received while said plurality of first mode signals of which levels change at said prescribed timing are received;

inputting a third mode signal at a first level;

outputting a first control signal when said third mode signal at said first level is received and said detection signal is received;

entering a prescribed state of operation in response to said first control signal;

inputting said third mode signal at a second level;

outputting a second control signal when said third mode signal at said second level is received and said detection signal is received; and going out from said prescribed state of operation in response to said second control signal.

11. The method of operating a semiconductor memory device according to claim 10, wherein one of said plurality of first mode signals is a row address strobe signal;

another of said plurality of first mode signals is a column address strobe signal;

still another of said plurality of first mode signals is a write enable signal;

said second mode signal is a signal input through any of a plurality of address pins; and said third mode signal is a signal input through at least one of said plurality of address pins other than that one through which said second external signal is input.

12. The method of operating a semiconductor memory device according to claim 11, wherein said prescribed timing is a timing at which said row address strobe signal attains to a third level after said column address strobe signal has attained to a fourth level and said write enable signal has attained to a fifth level.

13. The method of operating a semiconductor memory device according to claim 12, wherein said prescribed state of operation is a test mode.

14. The method of operating a semiconductor memory device according to claim 5, further comprising the steps of:

outputting a third control signal when said plurality of first mode signals of which levels change at said prescribed timing are received;

entering another prescribed state of operation in response to said third control signal;

outputting a fourth control signal when said plurality of first mode signals of which levels change at the other prescribed timing are received; and going out from said other prescribed state of operation in response to said fourth control signal.

15. The method of operating a semiconductor memory device according to claim 14, wherein said other prescribed state of operation is a test mode.

16. The method of operating a semiconductor memory device according to claim 14, wherein one of said plurality of first mode signals is a row address strobe signal;

another of said plurality of first mode signals is a column address strobe signal; and still another of said plurality of first mode signals is a write enable signal.

17. The method of operating a semiconductor memory device according to claim 16, wherein said prescribed timing is a timing at which said row address strobe signal attains to a third level after said column address strobe signal has attained to a fourth level and said write enable signal has attained to a fifth level, and said other prescribed timing is a timing at which said row address strobe signal attains to a sixth level after having attained to a seventh level for a certain time period while said column address strobe signal is at an eighth level.

18. The method of operating a semiconductor memory device according to claim 16, wherein said prescribed timing is a timing at which said row address strobe signal attains to a third level after said column address strobe signal has attained to a fourth level and said write enable signal has attained to a fifth level, and said other prescribed timing is a timing at which said row address strobe signal attains to a ninth level after having attained to a tenth level following said column address strobe signal attaining to an eleventh level.

* * * * *